(12) United States Patent
Friegel et al.

(10) Patent No.: US 11,162,992 B2
(45) Date of Patent: Nov. 2, 2021

(54) ENERGY STORAGE DEVICE AND DEVICE AND METHOD FOR DETERMINING A CAPACITANCE OF AN ENERGY STORAGE DEVICE

(71) Applicant: Bayerische Motoren Werke Aktiengesellschaft, Munich (DE)

(72) Inventors: Armin Friegel, Munich (DE); Philipp Riemann, Munich (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 67 days.

(21) Appl. No.: 16/801,913

(22) Filed: Feb. 26, 2020

(65) Prior Publication Data
US 2020/0191845 A1   Jun. 18, 2020

Related U.S. Application Data

(63) Continuation of application No. PCT/EP2018/074751, filed on Sep. 13, 2018.

(30) Foreign Application Priority Data

Oct. 12, 2017 (DE) .................... 10 2017 218 211.3

(51) Int. Cl.
*G01R 27/26* (2006.01)
*G01R 31/396* (2019.01)
*G01R 31/388* (2019.01)

(52) U.S. Cl.
CPC ....... *G01R 27/2605* (2013.01); *G01R 31/388* (2019.01); *G01R 31/396* (2019.01)

(58) Field of Classification Search
CPC .......................... G01R 27/2605; G01R 31/396; G01R 31/388; G01R 19/16542
USPC .......................................................... 324/434
See application file for complete search history.

(56) References Cited

U.S. PATENT DOCUMENTS

2011/0187378 A1* 8/2011 Boehm ................. H02J 7/0021
324/427
2017/0212171 A1 7/2017 Sejima

FOREIGN PATENT DOCUMENTS

| DE | 10 2005 025 616 A1 | 12/2006 |
|---|---|---|
| DE | 10 2007 011 519 A1 | 9/2008 |
| DE | 10 2008 041 103 A1 | 2/2010 |
| DE | 10 2009 038 663 A1 | 7/2011 |
| DE | 10 2013 203 809 A1 | 9/2014 |
| DE | 10 2013 206 885 A1 | 9/2014 |
| DE | 10 2017 201 247 A1 | 7/2017 |
| EP | 2 224 257 A2 | 9/2010 |
| EP | 3 196 663 A1 | 7/2017 |

OTHER PUBLICATIONS

International Search Report (PCT/ISA/210) issued in PCT Application No. PCT/EP2018/074751 dated Jan. 3, 2019 with English translation (seven pages).

(Continued)

*Primary Examiner* — Farhana A Hoque
(74) *Attorney, Agent, or Firm* — Crowell & Moring LLP

(57) ABSTRACT

An energy storage device has a plurality of storage cells. In this case, each storage cell is designed to be connected in an offline operation and separately from the remaining storage cells to a device for determining the capacitance of the energy storage device.

11 Claims, 2 Drawing Sheets

(56) References Cited

OTHER PUBLICATIONS

German-language Written Opinion (PCT/ISA/237) issued in PCT Application No. PCT/EP2018/074751 dated Jan. 3, 2019 (eight pages).
German-language Search Report issued in German Application No. 10 2017 218 211.3 dated Nov. 8, 2017 with partial English translation (11 pages).

* cited by examiner

ENERGY STORAGE DEVICE AND DEVICE AND METHOD FOR DETERMINING A CAPACITANCE OF AN ENERGY STORAGE DEVICE

CROSS REFERENCE TO RELATED APPLICATIONS

This application is a continuation of PCT International Application No. PCT/EP2018/074751, filed Sep. 13, 2018, which claims priority under 35 U.S.C. § 119 from German Patent Application No. 10 2017 218 211.3, filed Oct. 12, 2017, the entire disclosures of which are herein expressly incorporated by reference.

BACKGROUND AND SUMMARY OF THE INVENTION

The present invention relates to an energy storage device having a plurality of storage cells. The invention further relates to a device for determining the capacitance of such an energy storage device, and to a method for determining the capacitance of an energy storage device.

Electrical energy stores such as, for example, high-voltage stores—specifically high-voltage stores employing lithium-ion technology, with a rated voltage equal to or greater than 60 V—or stores having a lower voltage, e.g. 12 V, lose capacitance over the course of their service life. This loss of capacitance is associated, among other things, with the ageing of the storage cells of the high-voltage store. If the loss of capacitance is excessively high, it will be necessary, under certain circumstances, for the high-voltage store to be replaced.

Where energy stores are employed in electric vehicles in particular, it is interesting for the user to know the actual capacitance of the energy store. Although it is possible for the capacitance of the energy store to be measured directly in the vehicle, during the operation thereof, on-line measurements of this type are frequently inaccurate. Consequently, a more accurate capacitance measurement can only be executed off-line, i.e. not during operation. In existing systems, however, by an off-line capacitance measurement of this type, it is only possible for the capacitance of the high-voltage store to be measured in its totality. If cells having a different capacitance are incorporated in the high-voltage store, or said cells are subject to differential ageing—even in the most favorable case—only the capacitance of the cell with the smallest capacitance will be measured directly in the process, as this will delimit the detected voltage of the high-voltage store in both the upward and downward directions. In an unfavorable case, the mutual relationship of the voltages of the individual cells is such that even the capacitance of the cell having the lowest capacitance cannot be measured in full. A measurement of this type can therefore result in the detection of a loss of capacitance which does not necessarily correspond to the actual situation, as the capacitance of storage cells having a higher capacitance is not measured in full.

In this context, an object of the present invention is the improvement of the measurement of the capacitance of an electrical energy store.

This object is fulfilled by an energy storage device, by a device for determining the capacitance of an energy storage device, and by a method for determining the capacitance of an energy storage device, according to the claimed invention.

According to a first aspect, an energy storage device having a plurality of storage cells is provided, wherein the capacitance of each individual storage cell of the energy storage device is detected, in order to improve the measurement of the capacitance of the energy storage device. In this manner, information on the individual storage cells is provided, such that it is possible only to replace those cells which actually show a loss of capacitance of the relevant magnitude.

In order to achieve this, each storage cell of the energy storage device is designed, in off-line operation, separately from the remaining storage cells, to be connected to a device for determining the capacitance of the high-voltage energy storage device. The capacitance of each storage cell is detected accordingly. In the event of a loss of capacitance of a storage cell which exceeds a limiting value, said storage cell can be specifically replaced thereafter, without the necessity for the replacement of the entire energy storage device. The device can be arranged externally to the energy storage device, or can constitute an element of the energy storage device.

For the connection of storage cells to the device, on the one hand, each storage cell can be separately connected to the device by way of a connecting element. Alternatively, the plurality of storage cells can be connected to the device by way of a single connecting element. In the latter case, the connecting element comprises a plurality of contacts, which are assigned to the individual storage cells of the energy storage device. In this manner, the device can measure the capacitance of the individual storage cells via said contacts.

The energy storage device can be, for example, an energy store which can be employed in a motor vehicle. For example, the energy storage device can be a high-voltage energy storage device. The motor vehicle can be a conventional combustion engine vehicle, an electric vehicle or a hybrid vehicle, wherein the (high-voltage) energy storage device supplies an electric drive unit (electric motor or starter motor) with energy.

According to a further aspect, a motor vehicle having an energy storage device of the above-mentioned type is provided. The motor vehicle can specifically be a private car.

According to a further aspect, a device for determining the capacitance of an energy storage device having a plurality of storage cells is proposed, wherein the device comprises connecting elements for the connection thereof to each storage cell. The device can be arranged externally to the energy storage device, or can constitute an element of the energy storage device. In each case, no on-line measurement of the storage cells is executed in-service, wherein measurements are only executed out-of-service, for example in a workshop. The device comprises a discharging/charging unit and a calculation unit.

In order to determine the exact capacitance, and thus the loss of capacitance of the energy storage device, the discharging/charging unit is designed to be connected to the storage cells of the energy storage device, specifically in off-line operation, in order to discharge the storage cells, and to charge the latter thereafter. The discharging and charging of storage cells are preferably executed in an interconnected arrangement. A storage cell can thus be understood as an individual storage cell, or as a parallel-connected arrangement of a plurality of storage cells, which functions as a single storage cell.

During the charging process which succeeds the discharging process, the calculation unit is designed to monitor the voltage level of each storage cell of the energy storage device. Thus, conversely to known systems, rather than the determination of the capacitance of the entire energy storage device, the capacitance of each individual storage cell is determined, wherein the voltage level thereof is monitored. In this manner, it can be prevented that an excessively low capacitance is assigned to the entire energy storage device, notwithstanding the origin thereof either only from an unfavorable ratio of the cell voltages to one another (imbalance), or from one individual storage cell only. It can moreover be determined which storage cell shows an excessively low capacitance, and the loss of capacitance can thus be assigned to individual storage cells.

The discharging/charging unit and/or the calculation unit can be implemented by way of a hardware solution and/or a software solution. In the case of implementation by way of a hardware solution, the respective unit can be configured as a device or as part of a device, for example as a computer or as a microprocessor. In the case of implementation by way of a software solution, the respective unit can be configured as a computer program product, as a function, as a routine, as an element of program code or as an executable object.

According to a further embodiment, the calculation unit is designed, during the discharging of the energy storage device, to save a lower cell voltage of each storage cell at the end of the discharging process and, during the charging of the energy storage device, to save an upper cell voltage of each storage cell at the end of the charging process. The calculation unit is moreover designed to compare the lower cell voltages of the storage cells and the upper cell voltages of the corresponding storage cells and, on the basis of the result of the comparison, to calculate an available capacitance of each of the storage cells.

The cell voltages of each individual storage cell are thus measured and compared in a direct manner. Determination of the capacitance of the individual storage cells is thus possible in a simple manner, as said capacitance can be calculated directly on the basis of the upper and lower cell voltages of each storage cell.

Rather than the complete discharging and the subsequent complete recharging of each storage cell, it can also be provided that the discharging of the storage cells is initiated simultaneously, and continues up to a first time point, at which a first of the storage cells achieves a lower voltage limit and that, thereafter, all the storage cells are charged up to a second time point, at which a first of the storage cells achieves an upper voltage limit. The upper voltage limit can define a target charging voltage. In this case, the cell voltages of the storage cells at the first time point and the cell voltages of the storage cells at the second time point are likewise compared, and the actual capacitance is determined by upscaling on the basis of known values for the respective storage cells.

If the calculation unit determines that the available capacitance lies below a predefined limiting value, it can generate a signal on the basis of the available capacitance calculated which indicates whether a storage cell is to be replaced. Specifically, the calculation unit can indicate which storage cell is to be replaced. The targeted replacement of individual cells is thus possible.

According to a further embodiment, the discharging/charging unit is designed to discharge the storage cells up to a first time point, at which a first of the storage cells of the energy storage device achieves a predefined lower voltage limit, and to identify and tag said storage cell. Thereafter, the discharging/charging unit charges each of the storage cells up to a second time point, at which a first of the storage cells of the energy storage device achieves a predefined upper voltage limit, and identifies and tags said storage cell.

The tagged storage cells thus correspond to those cells, the voltage level of which is the first to reach the lower or upper voltage limit. According to a further form of embodiment, the calculation unit is further designed to determine the voltage level of each storage cell at the second time point. On the basis of this information, it can then be determined whether calibration of the storage cells is required. This form of embodiment is based upon the fact that, in the capacitance measurement of the energy storage device, imbalances between the states of charge of the storage cells can occur at the various time points, for example on the grounds that one storage cell has a lower capacitance than the other storage cells, or on the grounds of differences in the charging time of the storage cells. As a result, the voltage of one cell can delimit the measurement of capacitance at the lower end, whereas another cell delimits the latter at the upper end, if the storage cells have different voltage characteristics.

In the ideal case, there is no imbalance between the states of charge of the storage cells. This means that the voltage of the storage cell of the energy storage device having the lowest capacitance delimits the measurement at both the upper and the lower end. In this case, i.e. where the tagged storage cells are one and the same storage cell, the calculation unit is designed to determine a capacitance of the high-voltage energy storage unit on the basis of the difference in the voltage level of the tagged storage cell at the first and the second time point.

Once the capacitance has been established, the calculation unit can then determine whether the capacitance lies below a predefined limiting value and, if this is the case, can generate a signal which indicates that the tagged storage cell is to be replaced. The storage cell with the lowest capacitance can thus be identified and replaced in a targeted manner.

In one embodiment, the determination of capacitance can be executed by way of repetition thereafter, in order to determine whether further storage cells show an excessively low capacitance, and in order to the replace the latter in a targeted manner.

If the tagged storage cells are different storage cells, i.e. an imbalance is present, the calculation unit is designed to calculate a difference in the upper voltage levels of the tagged storage cells at the second time point, and to calibrate the energy storage device on the basis of the calculated difference.

In order to calibrate the energy storage device, the time point of the start of the charging process for the tagged storage cells is adjusted such that the latter achieve the predefined upper voltage limit at the same second time point. This means that the time point of the start of the charging process for one of the tagged storage cells is displaced, such that both achieve the upper voltage limit simultaneously. Calibration of this type can also be described as the symmetrization of the storage cells.

Further to calibration, the discharging/charging unit can then discharge and charge the energy storage device once more. The discharging/charging process can thus be executed iteratively by means of the discharging/charging unit and the calculation unit, until such time as the calculated difference in the upper voltage levels of the storage cells lies below a predefined limiting value.

In order to establish, after calibration, whether a storage cell is to be replaced, the calculation unit is further designed to determine whether the capacitance of the tagged storage cells, which is achieved within the time interval from the start of charging, specifically from the adjusted time point, to the achievement of the specified upper voltage limit, lies below a predefined limiting value. If this is the case, the storage cell is not delivering the requisite capacitance, and should therefore be replaced. If the capacitance determined thus lies below the predefined limiting value, a signal can be generated which indicates that the tagged storage cell is to be replaced.

According to a further aspect, a method is provided for determining the capacitance of an energy storage device having a plurality of storage cells. The method comprises the following steps: connection of each storage cell of the energy storage device to a device for determining capacitance; discharging of the storage cells and subsequent charging of the storage cells; monitoring of the voltage level of each of the storage cells of the energy storage device during the charging process which succeeds the discharging process.

Embodiments and characteristics described with respect to the device apply correspondingly to the method.

A method of this type can be executed, for example, as follows:

Discharging of the energy storage device, or of each storage cell,

Interruption of discharging, where a first of the storage cells achieves a lower voltage limit (at a first time point), Saving of all the cell voltages at the interruption of discharging, Charging of the energy storage device, or of each storage cell, Interruption of charging, where a first of the storage cells achieves an upper voltage limit (at a second time point), Saving of all the cell voltages at the time point of interruption of charging, Calculation of the difference between the lower voltage and the upper voltage for each storage cell, in order to determine the capacitance for each storage cell. Alternatively, the unmeasured capacitance components upon discharging (lower voltage range) and upon charging (upper voltage range) can be calculated for each cell, i.e. calculation of the difference between the stored cell voltage and the actual voltage to be achieved (this corresponds to the upper voltage limit). Thereafter, cell capacitances can be determined by upscaling the measured capacitance to 100%, with the application of the calculated difference.

Alternatively, capacitance measurement can be executed as follows:

Discharging of the energy storage device, or of the individual storage cells,

Interruption of discharging, where a first of the storage cells achieves a lower voltage limit (first time point), Tagging of this storage cell, Charging of the energy storage device, or of the individual storage cells, Initiation of charge metering for capacitance measurement, based upon the lower voltage level, Interruption of charging, where a first of the storage cells achieves an upper voltage limit (second time point), Interruption of charge metering for capacitance measurement, Tagging of this storage cell, If the tagged storage cells are one and the same, the potential imbalance is equal to zero. From this, it can be assumed that the capacitance measurement features no inaccuracy associated with an imbalance, and the capacitance of the energy storage device is delimited by the storage cell having the smallest capacitance. This storage cell can then be replaced.

If the tagged storage cells are different: constitution of the voltage difference, at the time of interruption of charging, between the upper voltage limit (=the voltage of the second tagged storage cell) minus the voltage of the first tagged storage cell. On the basis of this difference, calibration of the storage cells can be executed, as described above.

Alternatively, this voltage difference can be considered as a component of the unmeasured capacitance of the first storage cell, and converted into an information element which describes the percentage by which the capacitance measurement, on the grounds of an imbalance, i.e. a difference in the voltage characteristic of the storage cells, is too low. This imbalance can then be resolved by means of the above-mentioned calibration.

A computer program product is further provided, incorporating a program code which is configured to initiate the execution of the above-mentioned method on a computer.

A computer program product such as, e.g. a computer program, can be supplied or delivered, for example, in the form of a storage medium such as e.g. a memory card, a USB stick, a CD-ROM or DVD, or in the form of a file which is downloadable from a network server. This can be executed, for example, in a wireless communication network by the transmission of a corresponding file containing the computer program product or the computer program means.

Further potential implementations of the invention also include combinations of the characteristics or embodiments described heretofore or hereinafter, with respect to the exemplary embodiments, which are not explicitly specified. A person skilled in the art will also add individual aspects by way of improvements or additions to the respective basic form of the invention.

Other objects, advantages and novel features of the present invention will become apparent from the following detailed description of one or more preferred embodiments when considered in conjunction with the accompanying drawings.

BRIEF DESCRIPTION OF THE DRAWINGS

In the figures, identical or functionally equivalent elements are identified by the same reference symbols, unless indicated otherwise.

DETAILED DESCRIPTION OF THE DRAWINGS

Figure 1:
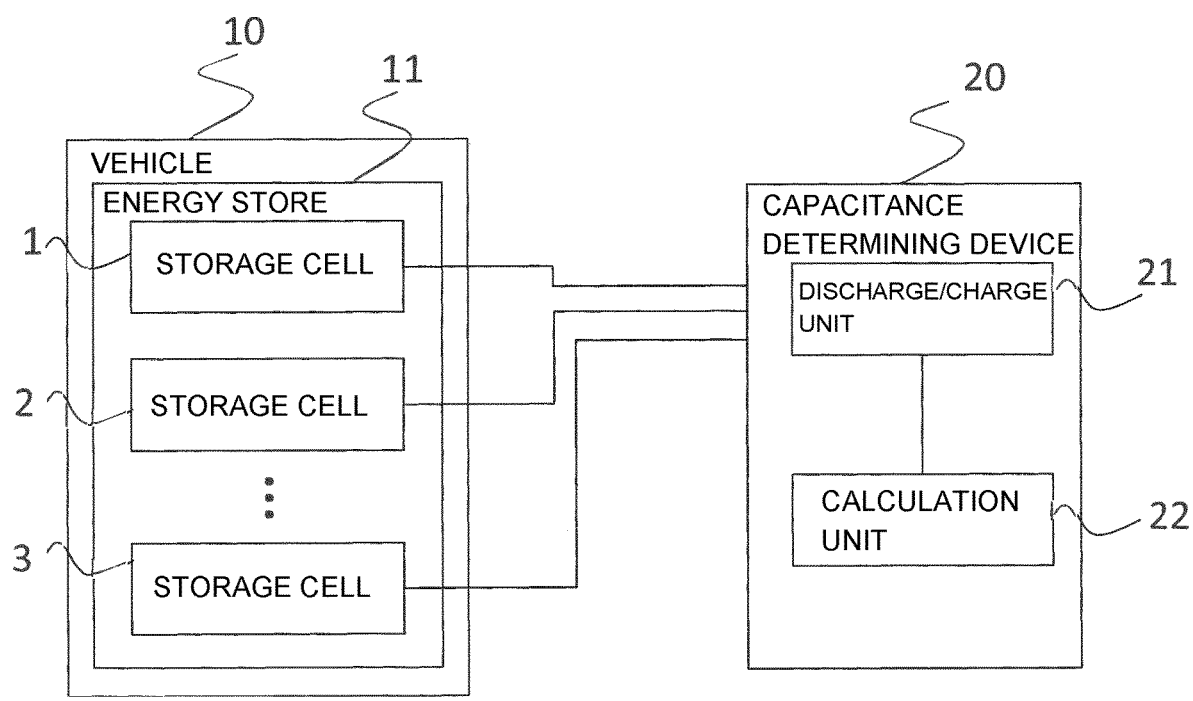
FIG. 1 is a schematic block diagram of a motor vehicle having an energy storage device and a device for determining an energy storage device.

FIG. 1 shows a motor vehicle 10 having an energy storage device 11. The energy storage device 11 comprises a plurality of storage cells 1, 2, 3 (although, in FIG. 1, three cells are represented by way of an example, any other number of cells is also conceivable).

In order to determine the available capacitance of the energy storage device 11, or to calculate a loss of capacitance of the energy storage device 11, each storage cell 1, 2, 3 is connected to a device 20 for determining the capacitance of the energy storage device 11. Although the device 20 is illustrated externally to the energy storage device 11, it is also possible for the former to be integrated in the energy storage device.

This can be achieved by means of a direct coupling of each of the storage cells 1, 2, 3 with the device 20, as illustrated in FIG. 1. Alternatively, the plurality of storage cells 1, 2, 3 can be connected to the device 20 by way of a single connecting element, for example a plug connector. The connecting element can comprise a plurality of contacts, which are assigned to the individual storage cells 1, 2, 3 of the energy storage device 11.

Connection of the storage cells 1, 2, 3 with the device 20 is executed during off-line operation, i.e. is executed externally, for example in a workshop, and not during the operation of the motor vehicle 10.

By means of the device 20, the capacitance of each individual storage cell 1, 2, 3 of the energy storage device 11 can be detected. On the basis of this information, those storage cells 1, 2, 3 which actually show a loss of capacitance, or an excessively high loss of capacitance, can then be replaced.

In order to determine the capacitance of the energy storage device 11, the device 20 comprises a discharging/charging unit 21 and a calculation unit 22.

As described above, each of the storage cells 1, 2, 3 is connected to the device 20. Thereafter, the discharging/charging unit 21 firstly discharges the storage cells 1, 2, 3 until a first of the storage cells 1, 2, 3 reaches a lower voltage limit. Further to discharging, the storage cells 1, 2, 3 are charged, until the voltage of a first of the storage cells 1, 2, 3 achieves an upper voltage limit.

During the charging process, the voltage levels of the storage cells 1, 2, 3 are monitored, either by the energy storage unit 11 itself or by the calculation unit 22. After the completion of the charging process, the calculation unit 22 determines, by a comparison, which of the storage cells 1, 2, 3 is the first to reach the lower voltage limit (first time point) and the upper voltage limit (second time point) respectively.

If different storage cells 1, 2, 3 are involved, the calculation unit can execute a calibration of the storage cells 1, 2, 3. In a calibration operation of this type, the voltage characteristics of the storage cells 1, 2, 3 are displaced, wherein the voltage characteristic of the cell 1, 2, 3 which is the first to reach the upper voltage limit is displaced to the extent that, at the uppermost value, it coincides with the voltage characteristic of the cell 1, 2, 3 which is the first to reach the lower voltage limit.

Thereafter, the discharging and charging of the storage cells 1, 2, 3 can be executed once more, wherein the useful capacitance or the loss of capacitance of the storage cell 1, 2, 3 can then be determined, which reaches both the lower and the upper voltage limit. The corresponding storage cell 1, 2, 3 can then be replaced.

Alternatively, the charging capacitance of each individual storage cell 1, 2, 3 can be determined separately by the calculation unit 22. In this case, the cell voltage of each individual cell 1, 2, 3 can be measured directly and compared. If the energy storage unit 11 itself, or the calculation unit 22 determines that the loss of capacitance of a storage cell 1, 2, 3 exceeds a predefined limiting value, the corresponding storage cell 1, 2, 3 can be replaced. A targeted replacement of individual cells 1, 2, 3 is thus possible.

Various voltage characteristics C1, C2, C3 of the storage cells 1, 2, 3 are represented in FIGS. 2 to 5.

Figure 2:
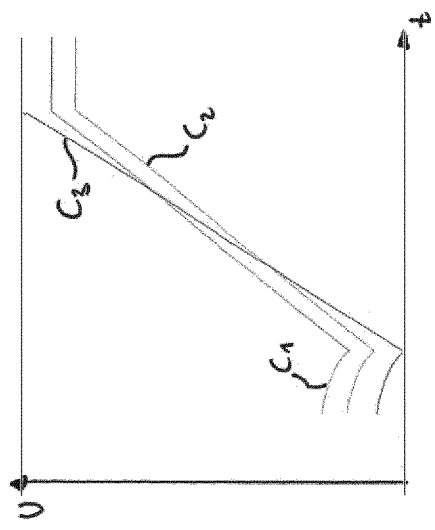
FIGS. 2 to 5 show different variants of the voltage characteristics of the storage cells of an energy storage device.

In the example represented in FIG. 2, the voltage characteristics C1, C2, C3 of the storage cells 1, 2, 3 are parallel. Storage cell 3 is the first to reach the lower voltage limit, whereas storage cell 1 is the first to reach the upper voltage limit. This results in an imbalance, as none of the storage cells 1, 2, 3 is detected in its full capacitance. In this case, a calibration of the storage cells 1 and 3 can therefore be executed. The voltage characteristic of storage cell 1 is displaced, until the upper value of curve C1 corresponds to the upper value of curve C2. In this case, the curves C1 and C3 are arranged contiguously, one above the other. Thereafter, the discharging/charging process can be executed once more.

Figure 3:
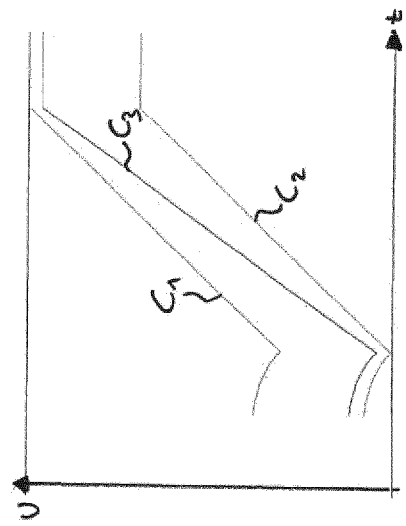

In the example represented in FIG. 3, the voltage characteristic C3 of storage cell 3 intersects with the voltage characteristics C1, C2 of storage cells 1, 2. Storage cell 3 is thus the first to reach the lower and the upper voltage limits. The useful capacitance is thus limited by this. If storage cell 3 is subject to a loss of capacitance, which exceeds a predefined limiting value, this storage cell 3 can be replaced.

Figure 4:
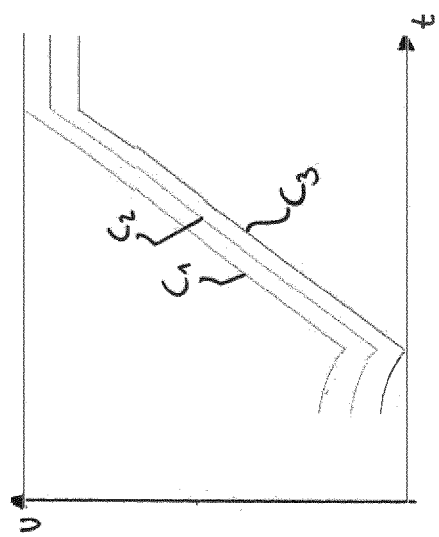

In the example represented in FIG. 4, the voltage characteristics C1 and C2 of storage cells 1 and 2 are parallel, whereas the voltage characteristic C3 of storage cell 3 partially intersects with the latter. Storage cell 3 is thus the first to reach the lower voltage limit, whereas storage cell 1 is the first to reach the upper voltage limit. This results in an imbalance, as none of the storage cells 1, 2, 3 is detected in its full capacitance. In this case, consequently, a calibration of storage cells 1 and 3 can likewise be executed. The voltage characteristic of storage cell 1 is displaced, until the upper value of curve C1 corresponds to the upper value of curve C3. Thereafter, the discharging/charging process can be executed once more.

Figure 5:
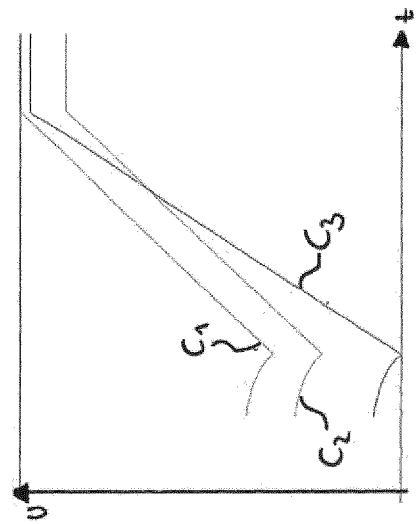

In the example represented in FIG. 5, the voltage characteristics C1 and C2 of storage cells 1 and 2 are likewise parallel, whereas the voltage characteristic C3 of storage cell 3 partially intersects with the latter. In this case, however, storage cell 2 is the first to reach the lower voltage limit, whereas storage cell 1 is the first to reach the upper voltage limit. This likewise results in an imbalance, as none of the storage cells is detected with in its full capacitance. In this case, consequently, a calibration of storage cells 1 and 2 can likewise be executed. The voltage characteristic of storage cell 1 is displaced, until the upper value of curve C2 corresponds to the upper value of curve C2. Curves C1 and C2 would then assume an overlapping arrangement. Thereafter, the discharging/charging process can be executed once more.

By means of the proposed energy storage device and the device, it is possible to determine the capacitance and the loss of capacitance of the individual storage cells of an energy storage device. In this manner, a more accurate determination of the capacitance of the energy storage device can be executed. Moreover, information on the capacitance of the individual storage cells is provided, such that it is possible for individual storage cells to be replaced as required, rather than the replacement of the entire energy storage device.

Although the present invention has been described with reference to exemplary embodiments, it is modifiable in a variety of ways.

REFERENCE SYMBOLS 1, 2, 3 Storage cells
10 Motor vehicle
11 Energy storage device
20 Device 21 Discharging/charging unit
22 Calculation unit
C1, C2, C3 Voltage characteristics The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A device for determining capacitance of an energy storage device having a plurality of storage cells, the device comprising:
    connecting elements for connection thereof to each storage cell;
    a discharging/charging unit; and
    a calculation unit, wherein
    the discharging/charging unit is designed to be connected to the storage cells of the energy storage device, and to discharge the storage cells, and to charge the latter thereafter,
    the calculation unit is designed, during the charging process which follows the discharging process, to monitor the voltage level of each of the storage cells of the energy storage device,
    the calculation unit is designed, during the discharging of the energy storage device, to save a lower cell voltage of each storage cell at the end of the discharging process and, during the charging of the energy storage device, to save an upper cell voltage of each storage cell at the end of the charging process, and
    the calculation unit is designed to compare the lower cell voltages of the storage cells and the upper cell voltages of the corresponding storage cells and, on the basis of the result of the comparison, to calculate an available capacitance of each of the storage cells.

2. The device according to claim 1, wherein
    the calculation unit is designed to determine whether the available capacitance lies below a predefined limiting value and, on the basis of the available capacitance calculated, to generate a signal which indicates whether and/or which storage cells are to be replaced.

3. A device for determining capacitance of an energy storage device having a plurality of storage cells, the device comprising:
    connecting elements for connection thereof to each storage cell;
    a discharging/charging unit; and
    a calculation unit, wherein
    the discharging/charging unit is designed to be connected to the storage cells of the energy storage device, and to discharge the storage cells, and to charge the latter thereafter,
    the calculation unit is designed, during the charging process which follows the discharging process, to monitor the voltage level of each of the storage cells of the energy storage device, and
    the discharging/charging unit is designed to discharge each of the storage cells up to a first time point, at which a first of the storage cells of the energy storage device achieves a predefined lower voltage limit, and to identify and tag said storage cell, and thereafter to charge each of the storage cells up to a second time point, at which a first of the storage cells of the energy storage device achieves a predefined upper voltage limit, and to identify and tag said storage cell.

4. The device according to claim 3, wherein
    the calculation unit is designed to determine the voltage level of each storage cell at the second time point.

5. The device according to claim 4, wherein
    where the tagged storage cells are one and the same storage cell, the calculation unit is designed to determine a capacitance of the energy storage unit on the basis of the difference in the voltage level of the tagged storage cell at the first and the second time point.

6. The device according to claim 5, wherein
    the calculation unit is designed to determine whether the capacitance lies below a predefined limiting value and, if this is the case, to generate a signal which indicates that the tagged storage cell is to be replaced.

7. The device according to claim 3, wherein
    where the tagged storage cells are one and the same storage cell, the calculation unit is designed to determine a capacitance of the energy storage unit on the basis of the difference in the voltage level of the tagged storage cell at the first and the second time point.

8. The device according to claim 3, wherein
    if the tagged storage cells are different storage cells, the calculation unit is designed to calculate a difference in the upper voltage levels of the tagged storage cells at the second time point, and to calibrate the energy storage device on the basis of the calculated difference, wherein
    the time point of the start of the charging process for the tagged storage cells is adjusted such that the latter achieve the predefined upper voltage limit at the same second time point, and
    the discharging/charging unit is designed to discharge and charge the energy storage device once more after calibration.

9. The device according to claim 8, wherein
    the discharging/charging unit and the calculation unit are designed to execute the discharging/charging process and the calibration process iteratively, until the calculated difference lies below a predefined limiting value.

10. The device according to claim 9, wherein
    the calculation unit is designed to determine whether the capacitance of the tagged storage cells, which is achieved within the time interval from the start of charging, specifically from the adjusted time point, to the achievement of the specified upper voltage limit, lies below a predefined limiting value and, if this is the case, to generate a signal which indicates that the tagged storage cell is to be replaced.

11. The device according to claim 8, wherein
    the calculation unit is designed to determine whether the capacitance of the tagged storage cells, which is achieved within the time interval from the start of charging, specifically from the adjusted time point, to the achievement of the specified upper voltage limit, lies below a predefined limiting value and, if this is the case, to generate a signal which indicates that the tagged storage cell is to be replaced.

* * * * *